(12) United States Patent
Kim

(10) Patent No.: US 10,651,829 B2
(45) Date of Patent: May 12, 2020

(54) SIGNAL RECEIVER CIRCUIT

(71) Applicant: SK hynix Inc., Gyeonggi-do (KR)

(72) Inventor: Min-Chang Kim, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/234,970

(22) Filed: Dec. 28, 2018

(65) Prior Publication Data

US 2019/0393864 A1 Dec. 26, 2019

(30) Foreign Application Priority Data

Jun. 26, 2018 (KR) .................. 10-2018-0073176

(51) Int. Cl.
*H03K 3/00* (2006.01)
*H03K 3/356* (2006.01)
(Continued)

(52) U.S. Cl.
CPC ............ *H03K 3/012* (2013.01); *H03K 5/023* (2013.01); *H03K 17/687* (2013.01); *H03K 19/018521* (2013.01); *H03K 2005/00078* (2013.01)

(58) Field of Classification Search
CPC ...... H03K 3/012; H03K 17/687; H03K 5/023; H03K 19/018521; H03K 2005/00078
See application file for complete search history.

(56) References Cited

U.S. PATENT DOCUMENTS 5,034,636 A * 7/1991 Reis .................... G06F 12/0895
326/55
5,355,391 A * 10/1994 Horowitz ............ G06F 13/4072
326/30
(Continued)

FOREIGN PATENT DOCUMENTS

KR 100279545 2/2001

OTHER PUBLICATIONS

Kim J. et al., Adaptive Supply Serial Links With Sub-1-V Operation and Per-Pin Clock Recovery, IEEE Journal of Solid-State Circuits Nov. 2002 pp. 1403-1413, vol. 37, No. 11, IEEE.

*Primary Examiner* — Kenneth B Wells
(74) *Attorney, Agent, or Firm* — IP & T Group LLP

(57) ABSTRACT

A signal receiver circuit includes: a negative voltage applier suitable for applying a negative voltage to a common source node in response to a first clock is at a first logic level; a first sampling transistor coupled between the common source node and a first sampling node to sink a current from the first sampling node to the common source node in response to a first input signal; a second sampling transistor coupled between the common source node and a second sampling node to sink a current from the second sampling node to the common source node in response to a second input signal; an equalizer suitable for equalizing the first sampling node and the second sampling node in response to the first clock is at a second logic level; a precharger suitable for precharging a first output node and a second output node with a pull-up voltage in response to a second clock is at the first logic level, and electrically coupling the first output node and second output node to the second sampling node and the first sampling node, respectively, in response to the second clock is at the second logic level; and an amplifier suitable for amplifying a voltage difference between the first output node and the second output node in response to the second clock is at the second logic level.

7 Claims, 2 Drawing Sheets

(51) Int. Cl.
     *H03K 5/1534*     (2006.01)
     *H04L 25/02*      (2006.01)
     *H03K 3/012*      (2006.01)
     *H03K 5/02*       (2006.01)
     *H03K 19/0185*    (2006.01)
     *H03K 17/687*     (2006.01)
     *H03K 5/00*       (2006.01)

(56) References Cited

U.S. PATENT DOCUMENTS

| | | | |
|---|---|---|---|
| 6,204,697 B1 * | 3/2001 | Zerbe | H03K 3/356121 |
| | | | 326/115 |
| 6,566,913 B2 * | 5/2003 | Dai | H03K 5/1534 |
| | | | 327/51 |
| 7,764,102 B2 * | 7/2010 | Pacha | H03K 3/356121 |
| | | | 327/208 |

\* cited by examiner

SIGNAL RECEIVER CIRCUIT

CROSS-REFERENCE TO RELATED APPLICATIONS

The present application claims priority under 35 U.S.C. § 119 to Korean Patent Application No. 10-2018-0073176, filed on Jun. 26, 2018, the disclosure of which is incorporated herein by reference in its entirety.

BACKGROUND

1. Field

Exemplary embodiments of the present invention relate to a signal receiver circuit which is used to receive a signal in various integrated circuits.

2. Description of the Related Art

A low-power system such as a mobile memory system uses an interface with a low termination scheme. When a low termination scheme is applied to an interface between integrated circuits, a voltage level of a signal transferred/received between the integrated circuits becomes very low, and thus a signal receiver circuit is required to recognize the transferred signal having the low voltage level.

Signal receiver circuits use strong arm latches. In a general strong arm latch, NMOS transistors are used for sampling input signals. However, in a low-power system using a low termination scheme, the voltage level of the input signals is too low to use NMOS transistors for sampling the input signals. Therefore, instead of the NMOS transistors, PMOS transistors are used to sample the input signals in the low-power system using the low termination scheme.

However, a PMOS transistor generally exhibits lower performance than an NMOS transistor. Thus, when PMOS transistors are used for sampling the input signals, the performance of the strong arm latch is lower than that of the case where NMOS transistors are used for sampling the input signals.

SUMMARY

Embodiments of the present invention are directed to a signal receiver circuit that operates at a high speed with a low power consumption, even when a voltage level of an input signal is low.

In accordance with an embodiment of the present invention, a signal receiver circuit includes: a negative voltage applier suitable for applying a negative voltage to a common source node in response to a first clock is at a first logic level; a first sampling transistor coupled between the common source node and a first sampling node to sink a current from the first sampling node to the common source node in response to a first input signal; a second sampling transistor coupled between the common source node and a second sampling node to sink a current from the second sampling node to the common source node in response to a second input signal; an equalizer suitable for equalizing the first sampling node and the second sampling node in response to the first clock is at a second logic level; a precharger suitable for precharging a first output node and a second output node with a pull-up voltage in response to a second clock is at the first logic level, and electrically coupling the first output node and second output node to the second sampling node and the first sampling node, respectively, in response to the second clock is at the second logic level; and an amplifier suitable for amplifying a voltage difference between the first output node and the second output node in response to the second clock is at the second logic level.

In accordance with another embodiment of the present invention, a signal receiver circuit includes: a negative voltage applier suitable for applying a negative voltage or a ground voltage to a common source node in response to a first clock; a first sampling NMOS transistor coupled between the common source node and a first sampling node to sink a current from the first sampling node to the common source node in response to a first input signal; a second sampling NMOS transistor coupled between the common source node and a second sampling node to sink a current from the second sampling node to the common source node in response to a second input signal; an equalizer suitable for equalizing the first sampling node and the second sampling node in response to the first clock; a first precharge PMOS transistor having a gate receiving a second clock, a source coupled to a pull-up voltage terminal, and a drain coupled to a first output node; a second precharge PMOS transistor having a gate receiving the second clock, a source coupled to the pull-up voltage terminal, and a drain coupled to a second output node; a first blocking NMOS transistor having a gate receiving the second clock, a source coupled to the first sampling node, and a drain coupled to the second output node; and a second blocking NMOS transistor having a gate receiving the second clock, a source coupled to the second sampling node, and a drain coupled to the first output node; and an amplifier suitable for amplifying a voltage difference between the first output node and the second output node in response to the second clock, wherein the second clock is an inverted and delayed clock of the first clock.

DETAILED DESCRIPTION

Figure 1:
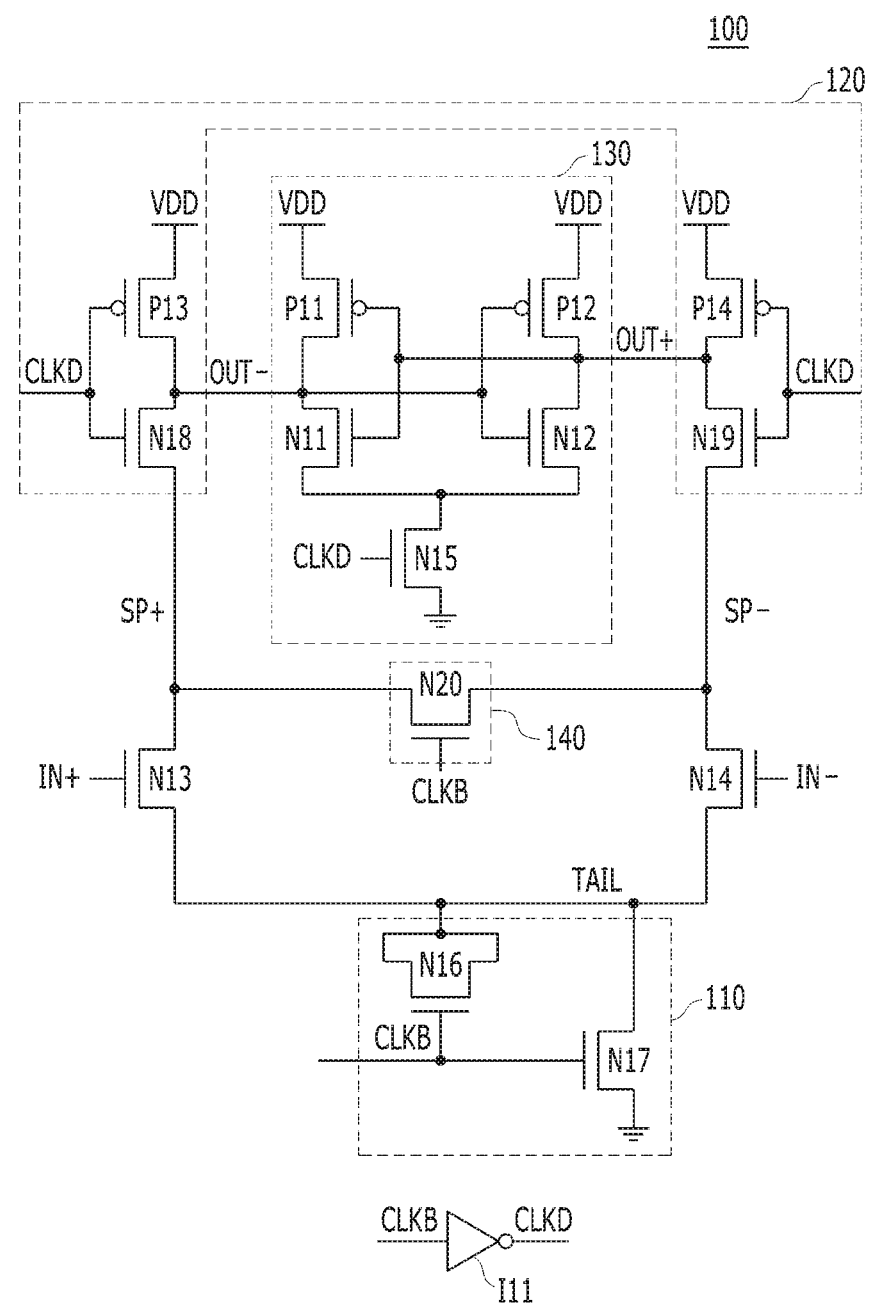
FIG. 1 is a circuit diagram illustrating a signal receiver circuit in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present. Communication between two elements, whether directly or indirectly connected/coupled, may be wired or wireless, unless stated or the context indicates otherwise.

As used herein, singular forms may include the plural forms as well and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Hereinafter, the various embodiments of the present invention will be described in detail with reference to the attached drawings.

FIG. 1 is a circuit diagram illustrating a signal receiver circuit 100 in accordance with an embodiment of the present invention.

Referring to FIG. 1, the signal receiver circuit 100 may include a negative voltage applier 110, sampling NMOS transistors N13 and N14, a precharger 120, an equalizer 140, and an amplifier 130. The signal receiver circuit 100 may use two clocks CLKB and CLKD. A delay clock CLKD may be a clock generated by inverting and delaying a clock CLKB by an inverter I11. For reference, the clock CLKB may be an inverted clock of a system clock CLK (not illustrated).

The negative voltage applier 110 may apply a negative voltage to a common source node TAIL in response to the clock CLKB. The negative voltage applier 110 may make the common source node TAIL to have a level of a ground voltage, i.e., 0 V, while the clock CLKB is at a logic high level, and apply a negative voltage to the common source node TAIL when the clock CLKB transitions from a logic high level to a logic low level. The negative voltage applier 110 may include an NMOS transistor N17 for sinking a current from the common source node TAIL to a ground terminal in response to the clock CLKB, and an NMOS transistor N16 that receives the clock CLKB through the gate and has a drain and a source which are coupled to the common source node TAIL, to operate as a capacitor. While the clock CLKB is at a logic high level, the NMOS transistor N17 may be turned on and the common source node TAIL may be driven by the ground voltage. The NMOS transistor N17 may be turned off while the clock CLKB is at a logic low level, and a negative voltage having a level lower than the ground voltage may be momentarily applied to the common source node TAIL due to a coupling effect of the NMOS transistor N16 operating as a capacitor.

The precharger 120 may initialize a positive output node OUT+ and a negative output node OUT− to have a level of a pull-up voltage, that is, a power source voltage VDD, while the delay clock CLKD is deactivated at a logic low level. Also, while the delay clock CLKD is activated to a logic high level, the precharger 120 may electrically couple the positive output node OUT+ to a negative sampling node SP− and electrically couple the negative output node OUT− to a positive sampling node SP+. The precharger 120 may include two PMOS transistors P13 and P14 (i.e., precharge PMOS transistors) and two NMOS transistors N18 and N19 (i.e., blocking NMOS transistors). When the delay clock CLKD is at a logic low level, the PMOS transistors P13 and P14 may be turned on so that the positive output node OUT+ and the negative output node OUT− are initialized to the pull-up voltage, i.e., VDD. When the delay clock CLKD is at a logic high level, the NMOS transistors N18 and N19 may be turned on so that the positive output node OUT+ and the negative output node OUT− are selectively coupled to the negative sampling node SP− and the positive sampling node SP+, respectively.

The sampling NMOS transistors N13 and N14 may sample a positive input signal IN+ and a negative input signal IN−, respectively. The sampling NMOS transistor N13 may sink a current from the positive sampling node SP+ to the common source node TAIL in response to the positive input signal IN+, and the NMOS transistor N14 may sink a current from the negative sampling node SP− to the common source node TAIL in response to the negative input signal IN−. The sampling NMOS transistors N13 and N14 may not be properly turned on when the voltage levels of the positive input signal IN+ and the negative input signal IN− are low. Therefore, it is hard to properly sample the positive input signal IN+ and the negative input signal IN− by using the sampling NMOS transistors N13 and N14. However, when the negative voltage is applied to the common source node TAIL by the negative voltage applier 110, the gate-source voltage Vgs of the sampling NMOS transistors N13 and N14 may be increased, which results in an effect that the voltage levels of the positive input signal IN+ and the negative input signal IN− may be increased relatively. Therefore, the positive input signal IN+ and the negative input signal IN− may be accurately sampled by using the sampling NMOS transistors N13 and N14.

The equalizer 140 may equalize the positive sampling node SP+ and the negative sampling node SP− to the same voltage level in response to the clock CLKB. The equalizer 140 may include an NMOS transistor N20 that receives the clock CLKB through its gate and has a drain and a source which are coupled to the positive sampling node SP+ and the negative sampling node SP−, respectively. The NMOS transistor N20 may equalize the positive sampling node SP+ and the negative sampling node SP− to the same voltage level while the clock CLKB is deactivated to a logic high level.

The amplifier 130 may amplify the voltage difference between the positive output node OUT+ and the negative output node OUT− while the delay clock CLKD is activated to a logic high level. A node having a higher voltage level between the positive output node OUT+ and the negative output node OUT− may become the pull-up voltage and a node having a lower voltage level between the positive output node OUT+ and the negative output node OUT− may become the ground voltage by an amplification operation of the amplifier 130. The amplifier 130 may have a scheme referred to as strong arm latches. The amplifier 130 may include CMOS inverter-coupled transistors P11 and N11 that have an input terminal coupled to the positive output node OUT+ and an output terminal coupled to the negative output node OUT−, and CMOS inverter-coupled transistors P12 and N12 that have an input terminal coupled to the negative output node OUT− and an output terminal coupled to the positive output node OUT+. While the delay clock CLKD is at a logic high level, the NMOS transistor N15 may be turned on so that an amplification operation is performed by the CMOS inverter-coupled transistors P11, N11, P12 and N12. While the delay clock CLKD is at a logic low level, the NMOS transistor N15 may be turned off so that the amplification operation is not performed by the CMOS inverter-coupled transistors P11, N11, P12, and N12.

Figure 2:
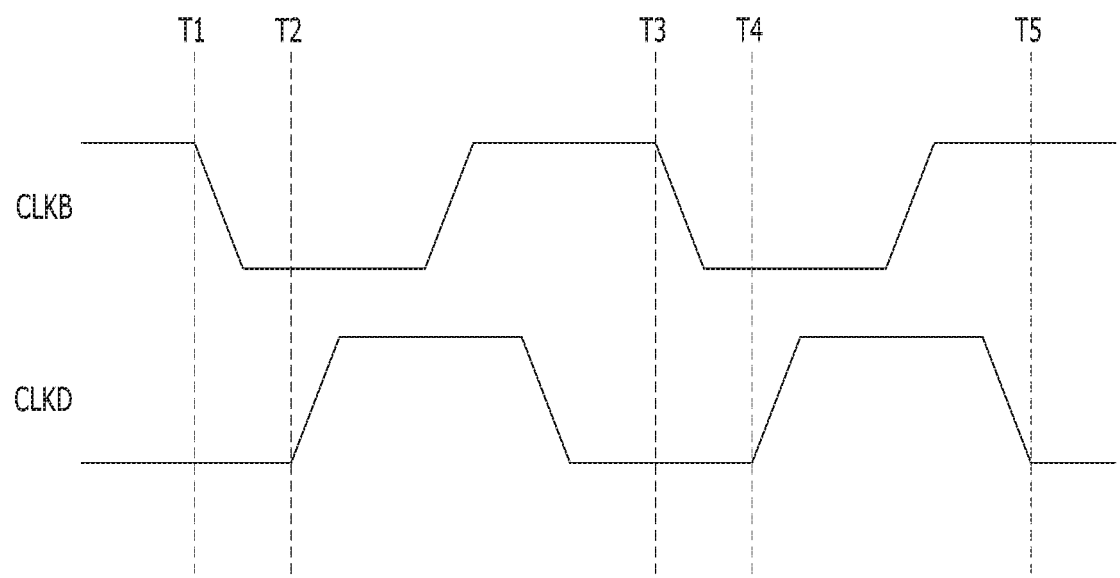
FIG. 2 is a diagram illustrating wave forms of clocks shown in FIG. 1.

FIG. 2 is a diagram illustrating wave forms of the clocks CLKB and CLKD shown in FIG. 1. Referring to FIGS. 1 and 2 together, the operation of the signal receiver circuit 100 is described.

Since the delay clock CLKD is deactivated at a logic low level before a moment T1, the precharger 120 may precharge the positive output node OUT+ and the negative output node OUT− to the pull-up voltage. Also, since the clock CLKB is at a logic high level before the moment T1, the positive sampling node SP+ and the negative sampling node SP− are equalized to have the same voltage level by the equalizer 140.

At the moment T1, the clock CLKB may start to transition from a logic high level to a logic low level so that the equalizer 140 is turned off, and the negative voltage applier 110 may apply the negative voltage to the common source node TAIL. Herein, the sampling NMOS transistors N13 and N14 may sample the positive input signal IN+ and the negative input signal IN−, and the sampled result may be loaded on the positive sampling node SP+ and the negative sampling node SP−. The NMOS transistors N18 and N19 are turned off so that a current path from the PMOS transistor P13 to the NMOS transistor N17 and a current path from the PMOS transistor P14 to the NMOS transistor N17 may be blocked.

At a moment T2, the delay clock CLKD may start to transition from a logic low level to a logic high level so that, in the precharger 120, the PMOS transistors P13 and P14 are turned off and the NMOS transistors N18 and N19 are turned on. As a result, the positive output node OUT+ and the negative sampling node SP− may be electrically coupled, and the negative output node OUT− and the positive sampling node SP+ may be electrically coupled. Also, the amplifier 130 may be enabled to amplify the voltage difference between the positive output node OUT+ and the negative output node OUT−.

In other words, the signal receiver circuit 100 may operate in the sequence of (1) precharging the positive output node OUT+ and the negative output node OUT− and equalizing the positive sampling node SP+ and the negative sampling node SP−, (2) sampling the positive input signal IN+ and the negative input signal IN− as the negative voltage is applied to the common source node TAIL and reflecting the sampled result into the positive sampling node SP+ and the negative sampling node SP−, (3) electrically coupling the positive sampling node SP+ and the negative sampling node SP− to the negative output node OUT− and the positive output node OUT+, respectively, and amplifying the voltage difference between the positive output node OUT+ and the negative output node OUT−.

The signal receiver circuit 100 may operate the same at the moments T3 and T4, just as they did at the moments T1 and T2.

After a moment T5, a standby section may begin in which the signal receiver circuit 100 does not operate. In the standby section, the clocks CLKB and CLKD do not toggle, and the clock CLKB may be fixed to a logic high level and the delay clock CLKD may be fixed to a logic low level. Since the clock CLKB is fixed to a logic high level during the standby section, the positive sampling node SP+ and the negative sampling node SP− may be equalized. Further, since the delay clock CLKD is fixed to a logic low level, the positive output node OUT+ and the negative output node OUT− may be precharged to the pull-up voltage.

Meanwhile, in the signal receiver circuit 100, there is no section where the PMOS transistor P13, the NMOS transistor N18 and the NMOS transistor N17 are simultaneously turned on. Neither is there a section where the PMOS transistor P14, the NMOS transistor N19, and the NMOS transistor N17 are simultaneously turned on. Therefore, there is no direct current path formed from a power source voltage terminal to a ground terminal, and the signal receiver circuit 100 may decrease the current consumption.

According to the embodiment of the present invention, the operation performance of the signal receiver circuit may be improved while decreasing the current consumption of the signal receiver circuit.

While the present invention has been described with respect to the specific embodiments, it will be apparent to those skilled in the art that various changes and modifications may be made without departing from the spirit and scope of the invention as defined in the following claims.

What is claimed is:
1. A signal receiver circuit, comprising:
   a negative voltage applier suitable for applying a negative voltage to a common source node in response to a first clock being at a first logic level, and applying a ground voltage to the common source node in response to the first clock being at a second logic level;
   a first sampling transistor coupled between the common source node and a first sampling node to sink a current from the first sampling node to the common source node in response to a first input signal;
   a second sampling transistor coupled between the common source node and a second sampling node to sink a current from the second sampling node to the common source node in response to a second input signal;
   an equalizer suitable for equalizing the first sampling node and the second sampling node in response to the first clock being at the second logic level;
   a precharger suitable for precharging a first output node and a second output node with a pull-up voltage in response to a second clock being at the first logic level, and electrically coupling the first output node and second output node to the second sampling node and the first sampling node, respectively, in response to the second clock being at the second logic level; and
   an amplifier suitable for amplifying a voltage difference between the first output node and the second output node in response to the second clock being at the second logic level,
   wherein the second clock is obtained by inverting and delaying the first clock, and
   wherein:
   during a first period in which the first clock is at the second logic level and the second clock is at the first logic level, the first and second output nodes are precharged, and the first and second sampling nodes are equalized;
   during a second period in which the first and second clocks are at the first logic level, the first and second input signals are sampled as the negative voltage is applied to the common source node to reflect the sampled result into the first and second sampling nodes; and
   during a third period in which the first clock is at the first logic level and the second clock is at the second logic level, the first and second output nodes are coupled to the first and second sampling nodes, respectively, and the voltage difference between the first and second output nodes is amplified.

2. The signal receiver circuit of claim 1, wherein each of the first sampling transistor and the second sampling transistor is an NMOS transistor.

3. The signal receiver circuit of claim 1, wherein the negative voltage applier includes:
   a first NMOS transistor suitable for sinking a current from the common source node to a ground terminal in response to the first clock; and a second NMOS transistor having a gate receiving the first clock, and a drain and a source coupled to the common source node.

4. The signal receiver circuit of claim 1, wherein the equalizer includes:
an NMOS transistor suitable for electrically coupling the first sampling node and the second sampling node to each other in response to the first clock.

5. The signal receiver circuit of claim 1, wherein the precharger includes:
a first PMOS transistor suitable for initializing the second output node to the pull-up voltage in response to the second clock;
a second PMOS transistor suitable for initializing the first output node to the pull-up voltage in response to the second clock;
a first NMOS transistor suitable for selectively coupling the second output node and the first sampling node in response to the second clock; and
a second NMOS transistor for selectively coupling the first output node and the second sampling node to each other in response to the second clock.

6. The signal receiver circuit of claim 1, wherein the amplifier includes:
first CMOS inverter-coupled transistors having an input terminal coupled to the first output node and an output terminal coupled to the second output node;
second CMOS inverter-coupled transistors having an input terminal coupled to the second output node and an output terminal coupled to the first output node; and
an NMOS transistor having a gate receiving the second clock, a source coupled to a ground terminal, a drain coupled to the first and second CMOS inverter-coupled transistors.

7. A signal receiver circuit, comprising:
a negative voltage applier suitable for applying a negative voltage or a ground voltage to a common source node in response to a first clock;
a first sampling NMOS transistor coupled between the common source node and a first sampling node to sink a current from the first sampling node to the common source node in response to a first input signal;
a second sampling NMOS transistor coupled between the common source node and a second sampling node to sink a current from the second sampling node to the common source node in response to a second input signal;
an equalizer suitable for equalizing the first sampling node and the second sampling node in response to the first clock;
a first precharge PMOS transistor having a gate receiving a second clock, a source coupled to a pull-up voltage terminal, and a drain coupled to a first output node;
a second precharge PMOS transistor having a gate receiving the second clock, a source coupled to the pull-up voltage terminal, and a drain coupled to a second output node;
a first blocking NMOS transistor having a gate receiving the second clock, a source coupled to the first sampling node, and a drain coupled to the second output node; and
a second blocking NMOS transistor having a gate receiving the second clock, a source coupled to the second sampling node, and a drain coupled to the first output node; and
an amplifier suitable for amplifying a voltage difference between the first output node and the second output node in response to the second clock,
wherein the second clock is an inverted and delayed clock of the first clock, and
wherein:
during a first period in which the first clock is at the second logic level and the second clock is at the first logic level, the first and second output nodes are precharged, and the first and second sampling nodes are equalized;
during a second period in which the first and second clocks are at the first logic level, the first and second input signals are sampled as the negative voltage is applied to the common source node to reflect the sampled result into the first and second sampling nodes; and
during a third period in which the first clock is at the first logic level and the second clock is at the second logic level, the first and second output nodes are coupled to the first and second sampling nodes, respectively, and the voltage difference between the first and second output nodes is amplified.

* * * * *